United States Patent
Dunn

(10) Patent No.: US 7,862,985 B2
(45) Date of Patent: *Jan. 4, 2011

(54) METHOD FOR DOUBLE PATTERNING A DEVELOPABLE ANTI-REFLECTIVE COATING

(75) Inventor: Shannon W. Dunn, Altamont, NY (US)

(73) Assignee: Tokyo Electron Limited, Tokyo (JP)

( * ) Notice: Subject to any disclaimer, the term of this patent is extended or adjusted under 35 U.S.C. 154(b) by 51 days.

This patent is subject to a terminal disclaimer.

(21) Appl. No.: 11/534,365

(22) Filed: Sep. 22, 2006

(65) Prior Publication Data

US 2008/0076074 A1    Mar. 27, 2008

(51) Int. Cl.
*G03F 7/22* (2006.01)
*G03C 5/04* (2006.01)

(52) U.S. Cl. ............... 430/313; 430/316; 430/394; 430/397

(58) Field of Classification Search ............... None
See application file for complete search history.

(56) References Cited

U.S. PATENT DOCUMENTS

| | | | |
|---|---|---|---|
| 5,753,417 A | 5/1998 | Ulrich | |
| 7,432,191 B1 | 10/2008 | Stamper et al. | |
| 2002/0081531 A1 | 6/2002 | Jain | |
| 2003/0129531 A1 | 7/2003 | Oberlander et al. | |
| 2003/0205658 A1 | 11/2003 | Voisin | |
| 2005/0074699 A1 | 4/2005 | Sun et al. | |
| 2005/0116231 A1 | 6/2005 | Kang et al. | |
| 2005/0153538 A1 | 7/2005 | Tsai et al. | |
| 2005/0167394 A1 | 8/2005 | Liu et al. | |
| 2006/0003268 A1 | 1/2006 | Hong et al. | |
| 2006/0177772 A1 * | 8/2006 | Abdallah et al. | 430/311 |
| 2006/0222968 A1 | 10/2006 | Talin et al. | |
| 2006/0223245 A9 * | 10/2006 | Pellens et al. | 438/167 |
| 2006/0290012 A1 | 12/2006 | Sadjadi | |
| 2007/0077523 A1 * | 4/2007 | Finders | 430/311 |
| 2007/0148598 A1 | 6/2007 | Colburn et al. | |
| 2007/0166648 A1 | 7/2007 | Ponoth et al. | |
| 2008/0020327 A1 | 1/2008 | Yang et al. | |
| 2008/0171293 A1 * | 7/2008 | Dunn | 430/323 |

OTHER PUBLICATIONS

European Patent Office, International Search Report and Written Opinion received in corresponding PCT Application No. PCT/US2007/077166 dated Dec. 20, 2007, 13 pgs.
U.S. Patent and Trademark Office, Non-final Office Action received in related U.S. Appl. No. 11/623,247 dated Oct. 9, 2008, 14 pp.
U.S. Patent and Trademark Office, Non-final Office Action received in related U.S. Appl. No. 11/534,261 dated Jun. 23, 2008, 14 pp.
U.S. Patent and Trademark Office, Non-final Office Action received in related U.S. Appl. No. 11/534,477 dated Jun. 23, 2008, 22 pp.
State Intellectual Property Office of the People'S Republic of China, First Office Action received in related Chinese Patent Application No. 200710151302.9 dated Jan. 16, 2009, 7 pp.
U.S. Patent and Trademark Office, Non-final Office Action received in related U.S. Appl. No. 11/534,477 dated Jan. 12, 2009, 14 pp.
U.S. Patent and Trademark Office, Non-final Office Action received in related U.S. Appl. No. 11/534,420 dated Dec. 23, 2008, 23 pp.
U.S. Patent and Trademark Office, Non-final Office Action received in related U.S. Appl. No. 11/534,261 dated Jan. 15, 2009, 12 pp.
U.S. Patent and Trademark Office, Non-final Office Action received in related U.S. Appl. No. 11/623,237 dated Sep. 15, 2009, 16 pp.
U.S. Patent and Trademark Office, Final Office Action received in related U.S. Appl. No. 11/534,261 dated Aug. 28, 2009, 12 pp.
U.S. Patent and Trademark Office, Final Office Action received in related U.S. Appl. No. 11/534,477 dated Aug. 7, 2009, 17 pp.
U.S. Patent and Trademark Office, Non-final Office Action received in related U.S. Appl. No. 11/534,538 dated Jul. 13, 2009, 16 pp.

(Continued)

*Primary Examiner*—Daborah Chacko Davis
(74) *Attorney, Agent, or Firm*—Wood, Herron & Evans, LLP

(57) ABSTRACT

A method for double patterning a thin film on a substrate is described. The method includes forming the thin film to be patterned on the substrate, forming a developable anti-reflective coating (ARC) layer on the thin film, and forming a layer of photo-resist on the ARC layer. Thereafter, the layer of photo-resist and the ARC layer are imaged with a first image pattern, and developed, thus forming the first image pattern in the ARC layer. The photo-resist is removed and another layer of photo-resist is formed on the ARC layer. Thereafter, the other layer of photo-resist and the ARC layer are imaged with a second image pattern, and developed, thus forming the second image pattern in the ARC layer. The other photo-resist layer is removed and a double patterned ARC layer remains for etching the underlying thin film.

15 Claims, 10 Drawing Sheets

OTHER PUBLICATIONS

U.S. Patent and Trademark Office, Non-final Office Action received in related U.S. Appl. No. 11/623,247 dated Jun. 2, 2009, 17 pp.

U.S. Patent and Trademark Office, Non-final Office Action received in related U.S. Appl. No. 11/534,477 dated Oct. 23, 2009, 16 pp.

U.S. Patent and Trademark Office, Final Office Action received in related U.S. Appl. No. 11/623,247 dated Dec. 18, 2009, 18 pp.

U.S. Patent and Trademark Office, Final Office Action received in related U.S. Appl. No. 11/534,538 dated Jan. 26, 2010, 12 pp.

U.S. Patent and Trademark Office, Non-Final Office Action received in related U.S. Appl. No. 11/623,237 dated Mar. 9, 2010, 18 pp.

U.S. Patent and Trademark Office, Advisory Action received in related U.S. Appl. No. 11/623,247 dated Mar. 10, 2010, 7 pp.

U.S. Patent and Trademark Office, Non-Final Official Action received in related U.S. Appl. No. 11/534,261 dated Apr. 5, 2010, 13 pp.

U.S. Patent and Trademark Office, Non-Final Official Action received in related U.S. Appl. No. 11/534,538 dated Apr. 12, 2010, 15 pp.

U.S. Patent and Trademark Office, Final Official Action received in related U.S. Appl. No. 11/534,477 dated Apr. 30, 2010, 10 pp.

U.S. Patent and Trademark Office, Non-Final Office Action received in related U.S. Appl. No. 11/534,477 dated Jul. 22, 2010, 14 pp.

* cited by examiner

METHOD FOR DOUBLE PATTERNING A DEVELOPABLE ANTI-REFLECTIVE COATING

CROSS-REFERENCE TO RELATED APPLICATIONS

This application is related to co-pending U.S. patent application Ser. No. 11/534,261 entitled "METHOD FOR DOUBLE IMAGING A DEVELOPABLE ANTI-REFLECTIVE COATING", filed on even date herewith; co-pending U.S. patent application Ser. No. 11/534,420, entitled "METHOD OF PATTERNING AN ANTI-REFLECTIVE COATING BY PARTIAL ETCHING", filed on even date herewith; co-pending U.S. patent application Ser. No. 11/534,477, entitled "METHOD OF PATTERNING A DEVELOPABLE ANTI-REFLECTIVE COATING BY PARTIAL DEVELOPING", filed on even date herewith; and co-pending U.S. patent application Ser. No. 11/534,538, entitled "METHOD FOR DOUBLE PATTERNING A THIN FILM", filed on even date herewith. The entire contents of these applications are herein incorporated by reference in their entirety.

BACKGROUND OF THE INVENTION

1. Field of the Invention

The present invention relates to a method for double patterning a thin film on a substrate, and more particularly to a method for double patterning a thin film on a substrate using a developable anti-reflective coating (ARC) layer.

2. Description of Related Art

In material processing methodologies, pattern etching comprises the application of a thin layer of light-sensitive material, such as photo-resist, to an upper surface of a substrate that is subsequently patterned in order to provide a mask for transferring this pattern to the underlying thin film on a substrate during etching. The patterning of the light-sensitive material generally involves exposure by a radiation source through a reticle (and associated optics) of the light-sensitive material using, for example, a photo-lithography system, followed by the removal of the irradiated regions of the light-sensitive material (as in the case of positive photo-resist), or non-irradiated regions (as in the case of negative resist) using a developing solvent. Moreover, this mask layer may comprise multiple sub-layers.

More recently, a double patterning approach has been introduced to allow the patterning of smaller features at a smaller pitch than what is currently possible with standard lithographic techniques. One approach to reduce the feature size is to use standard lithographic pattern and etch techniques on the same substrate twice, thereby forming larger patterns spaced closely together to achieve a smaller feature size than would be possible by single exposure. During double patterning, the substrate is exposed to a first pattern, the first pattern is developed in the light-sensitive material, the first pattern formed in the light-sensitive material is transferred to an underlying layer using an etching process, and then this series of steps is repeated for a second pattern.

SUMMARY OF THE INVENTION

The present invention relates to a method for double patterning a thin film on a substrate.

According to one embodiment, a method of double patterning a thin film using a developable anti-reflective coating (ARC) layer is described, wherein one or more dry etching steps for transferring one or more patterns into the developable ARC layer are omitted.

According to another embodiment, a method of double patterning a thin film on a substrate, and a computer readable medium for double patterning, are described, comprising: preparing a film stack on the substrate, the film stack comprising the thin film formed on the substrate, a developable anti-reflective coating (ARC) layer formed on the thin film, and a first layer of photo-resist formed on the developable ARC layer; imaging the first layer of photo-resist and the developable ARC layer with a first image pattern; developing the first layer of photo-resist and the developable ARC layer to form the first image pattern in the developable ARC layer; removing the first layer of photo-resist; forming a second layer of photo-resist on the developable ARC layer; imaging the second layer of photo-resist and the developable ARC layer with a second image pattern; and developing the second layer of photo-resist and the developable ARC layer to form the second image pattern in the developable ARC layer.

DETAILED DESCRIPTION OF EXEMPLARY EMBODIMENTS

In the following description, for purposes of explanation and not limitation, specific details are set forth, such as particular processes and patterning systems. However, it should be understood that the invention may be practiced in other embodiments that depart from these specific details.

Figure 1A:
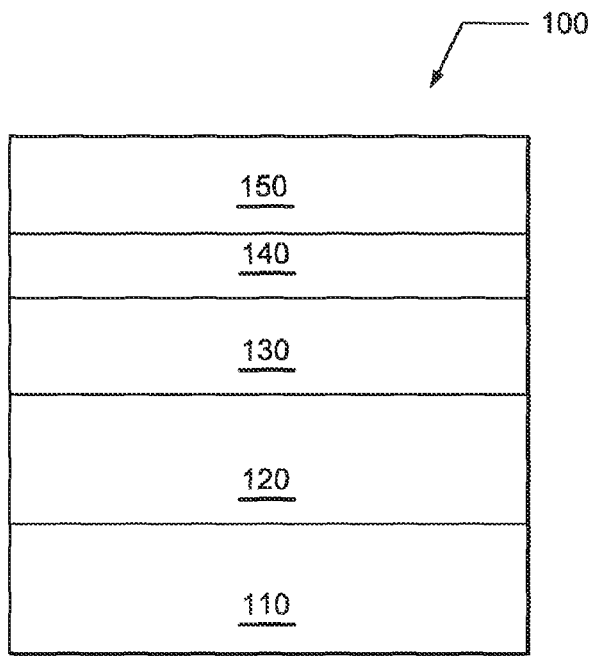
FIGS. 1A through 1J illustrate schematically a known method for double patterning a thin film on a substrate.

As described above, double patterning lithography has been utilized to allow the patterning of smaller features at a smaller pitch than what is currently possible with standard lithographic techniques. Referring now to the drawings wherein like reference numerals designate identical or corresponding parts throughout the several views, FIGS. 1A through 1J schematically illustrate a method of double patterning a substrate according to the prior art. As illustrated in FIG. 1A, a lithographic structure 100 comprises a film stack formed on substrate 110. The film stack comprises a thin film 120, such as a dielectric layer, formed on substrate 110, an organic planarization layer (OPL) 130 formed on the thin film 120, an anti-reflective coating (ARC) layer 140 formed on the OPL 130, and a layer of photo-resist 150 formed on the ARC layer 140.

Figure 1B:
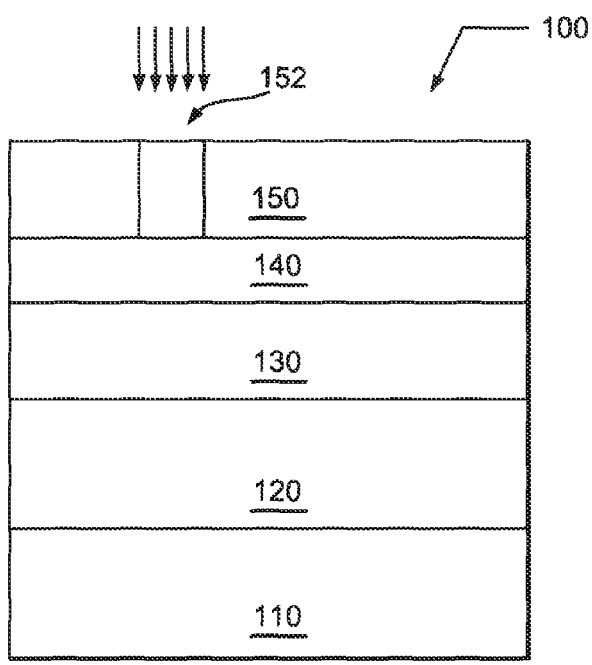
Figure 1C:
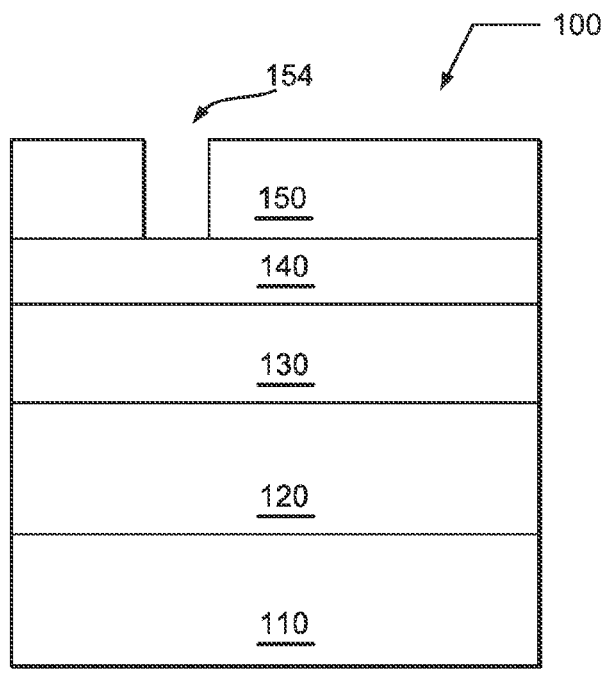
Figure 1D:
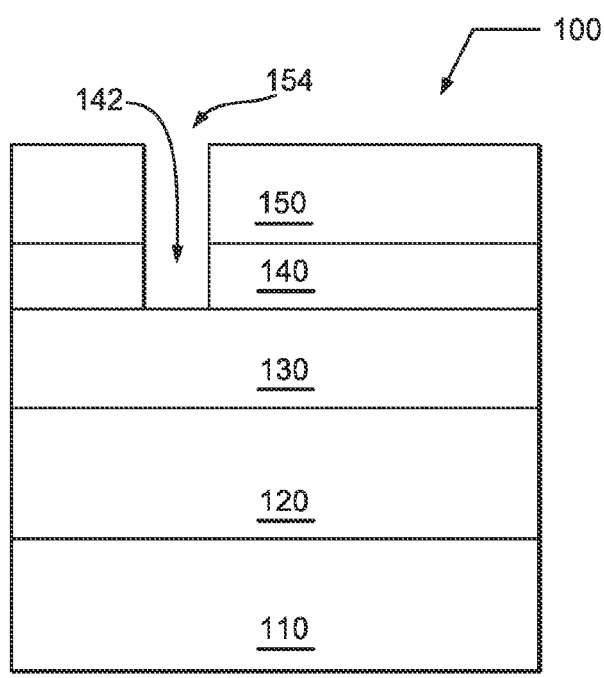

As shown in FIG. 1B, the photo-resist 150 is exposed to a first image pattern 152 using a photo-lithography system, and thereafter in FIG. 1C, the first image pattern 152 is developed in a developing solvent to form a first pattern 154 in the photo-resist layer 150. The first pattern 154 in the photo-resist layer 150 is transferred to the underlying ARC layer 140 using a dry etching process to form a first ARC pattern 142 as shown in FIG. 1D.

Figure 1E:
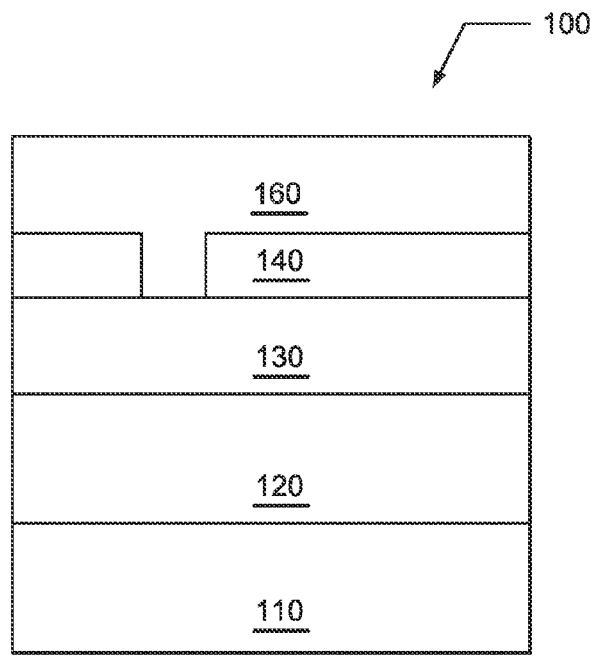
Figure 1F:
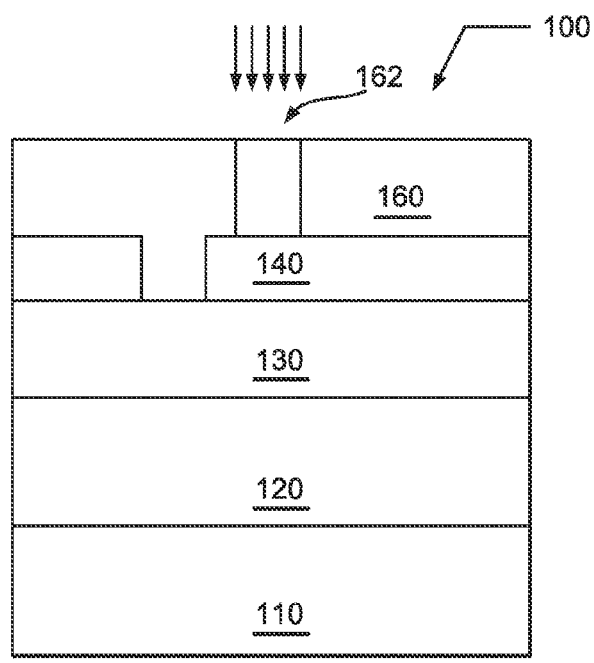
Figure 1G:
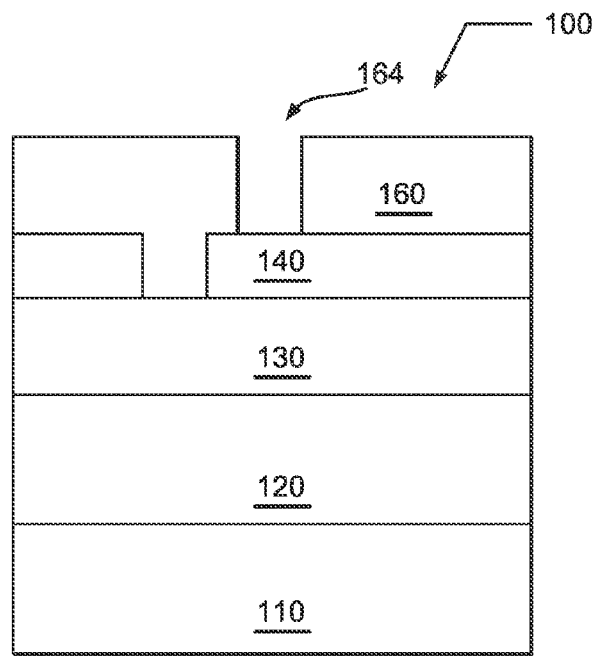
Figure 1H:
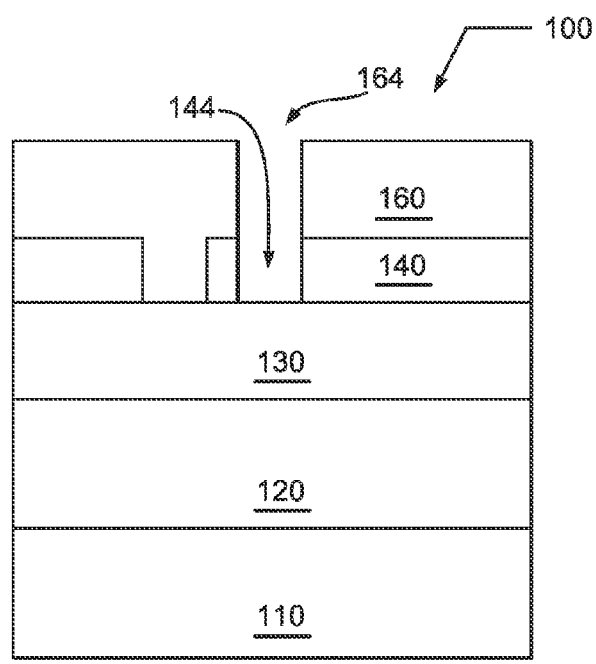

Now, as shown in FIG. 1E, photo-resist layer 150 is removed, and a second photo-resist layer 160 is applied to the ARC layer 140. The second photo-resist layer 160 is exposed to a second image pattern 162, as shown in FIG. 1F, using a photo-lithography system, and thereafter in FIG. 1G, the second image pattern 162 is developed in a developing solvent to form a second pattern 164 in the second photo-resist layer 160. The second pattern 164 in the second photo-resist layer 160 is transferred to the underlying ARC layer 140 using an etching process to form a second ARC pattern 144 as shown in FIG. 1H.

Figure 1I:
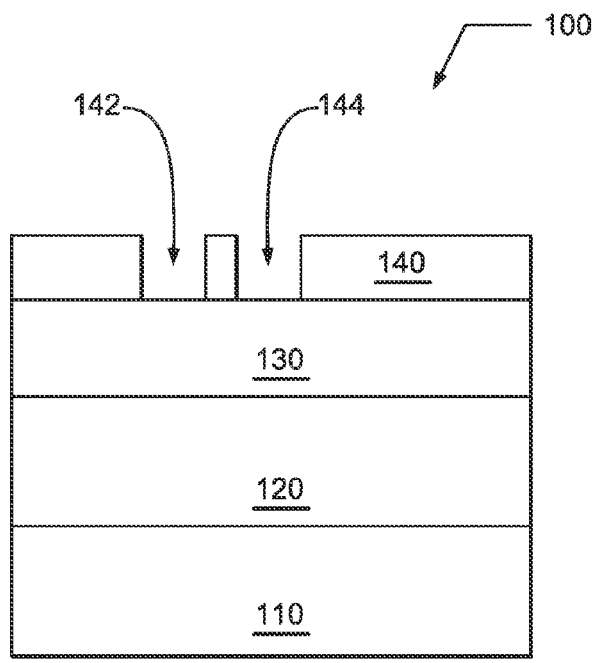
Figure 1J:
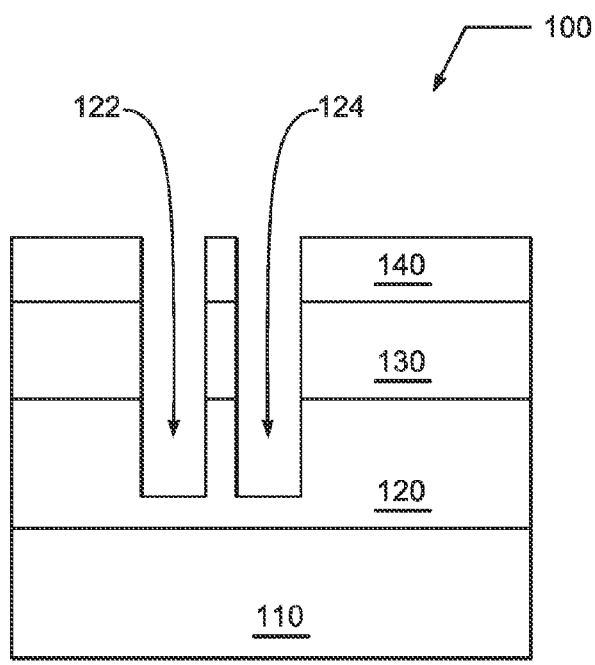

As illustrated in FIGS. 1I and 1J, respectively, the second layer of photo-resist 160 is removed, and the first and second ARC patterns 142 and 144 are transferred to the underlying OPL 130 and the thin film 120 to form a first feature pattern 122 and a second feature pattern 124 using one or more etching processes. However, the use of this procedure to double pattern thin film 120 is costly. For example, the substrate must cycle between the track and lithography systems, and the dry etching system twice, thus doubling the processing time and halving the substrate throughput.

Therefore, according to an embodiment of the invention, a method of double patterning a substrate is illustrated in FIGS. 2A through 2F, and FIG. 3. The method is illustrated in a flow chart 500, and begins in 510 with forming a lithographic structure 200 comprising a film stack formed on substrate 210. The film stack comprises a thin film 220 formed on substrate 210, an optional organic planarization layer (OPL) 230 formed on the thin film 220, a developable anti-reflective coating (ARC) layer 240 formed on the optional OPL 230 (or on the thin film 220 if there is no OPL 230), and a first layer of photo-resist 250 formed on the developable ARC layer 240. Although the film stack is shown to be formed directly upon substrate 210, there may exist additional layers between the film stack and the substrate 210. For example, in a semiconductor device, the film stack may facilitate the formation of one interconnect level, and this interconnect level may be formed upon another interconnect level on substrate 210. Additionally, the thin film 220 may include a single material layer, or a plurality of material layers. For example, the thin film 220 may comprise a bulk material layer having a capping layer.

The thin film 220 may comprise a conductive layer, a non-conductive layer, or a semi-conductive layer. For instance, the thin film 220 may include a material layer comprising a metal, metal oxide, metal nitride, metal oxynitride, metal silicate, metal silicide, silicon, poly-crystalline silicon (poly-silicon), doped silicon, silicon dioxide, silicon nitride, silicon carbide, silicon oxynitride, etc. Additionally, for instance, the thin film 220 may comprise a low dielectric constant (i.e., low-k) or ultra-low dielectric constant (i.e., ultra-low-k) dielectric layer having a nominal dielectric constant value less than the dielectric constant of $SiO_2$, which is approximately 4 (e.g., the dielectric constant for thermal silicon dioxide can range from 3.8 to 3.9). More specifically, the thin film 220 may have a dielectric constant of 3.7 or less, such as a dielectric constant ranging from 1.6 to 3.7.

These dielectric layers may include at least one of an organic, inorganic, or inorganic-organic hybrid material. Additionally, these dielectric layers may be porous or non-porous. For example, these dielectric layers may include an inorganic, silicate-based material, such as carbon doped silicon oxide (or organo siloxane), deposited using CVD techniques. Examples of such films include Black Diamond® CVD organosilicate glass (OSG) films commercially available from Applied Materials, Inc., or Coral® CVD films commercially available from Novellus Systems, Inc. Alternatively, these dielectric layers may include porous inorganic-organic hybrid films comprised of a single-phase, such as a silicon oxide-based matrix having $CH_3$ bonds that hinder full densification of the film during a curing or deposition process to create small voids (or pores). Still alternatively, these dielectric layers may include porous inorganic-organic hybrid films comprised of at least two phases, such as a carbon-doped silicon oxide-based matrix having pores of organic material (e.g., porogen) that is decomposed and evaporated during a curing process. Still alternatively, these dielectric layers may include an inorganic, silicate-based material, such as hydrogen silsesquioxane (HSQ) or methyl silsesquioxane (MSQ), deposited using SOD (spin-on dielectric) techniques. Examples of such films include FOx® HSQ commercially available from Dow Corning, XLK porous HSQ commercially available from Dow Corning, and JSR LKD-5109 commercially available from JSR Microelectronics. Still alternatively, these dielectric layers can comprise an organic material deposited using SOD techniques. Examples of such films include SiLK-I, SiLK-J, SiLK-H, SiLK-D, and porous SiLK® semiconductor dielectric resins commercially available from Dow Chemical, and GX-3™, and GX-3P™ semiconductor dielectric resins commercially available from Honeywell.

The thin film 220 can be formed using a vapor deposition technique, such as chemical vapor deposition (CVD), plasma enhanced CVD (PECVD), atomic layer deposition (ALD), plasma enhanced ALD (PEALD), physical vapor deposition (PVD), or ionized PVD (iPVD), or a spin-on technique, such as those offered in the Clean Track ACT 8 SOD (spin-on dielectric), ACT 12 SOD, and Lithius coating systems commercially available from Tokyo Electron Limited (TEL). The Clean Track ACT 8 (200 mm), ACT 12 (300 mm), and Lithius (300 mm) coating systems provide coat, bake, and cure tools for SOD materials. The track system can be configured for processing substrate sizes of 100 mm, 200 mm, 300 mm, and greater. Other systems and methods for forming a thin film on a substrate are well known to those skilled in the art of both spin-on technology and vapor deposition technology.

The optional OPL 230 can include a photo-sensitive organic polymer or an etch type organic compound. For instance, the photo-sensitive organic polymer may be polyacrylate resin, epoxy resin, phenol resin, polyamide resin, polyimide resin, unsaturated polyester resin, polyphenylenether resin, polyphenylenesulfide resin, or benzocyclobutene (BCB). These materials may be formed using spin-on techniques.

The developable ARC layer 240 possesses material properties suitable for use as an anti-reflective coating. Additionally, the developable ARC layer 240 comprises a light-sensitive material that, when exposed to electro-magnetic (EM) radiation, is chemically altered and thus configured to be removed using a developing solvent. For example, the developable ARC layer 240 may comprise (wet) developable anti-reflective coatings commercially available from Brewer Science. Inc. (2401 Brewer Drive, Rolla, Mo. 65401). Additionally, the developable ARC layer 240 is selected to be compatible with the overlying first photo-resist layer 250 and the lithographic wavelength, i.e., ArF, KrF, etc., as well as with a second photo-resist layer 260, as will be discussed below.

The first photo-resist layer 250 may comprise 248 nm (nanometer) resists, 193 nm resists, 157 nm resists, or EUV (extreme ultraviolet) resists. The photo-resist layer 250 can be formed using a track system. For example, the track system can comprise a Clean Track ACT 8, ACT 12, or Lithius resist coating and developing system commercially available from Tokyo Electron Limited (TEL). Other systems and methods for forming a photo-resist film on a substrate are well known to those skilled in the art of spin-on resist technology.

Figure 2A:
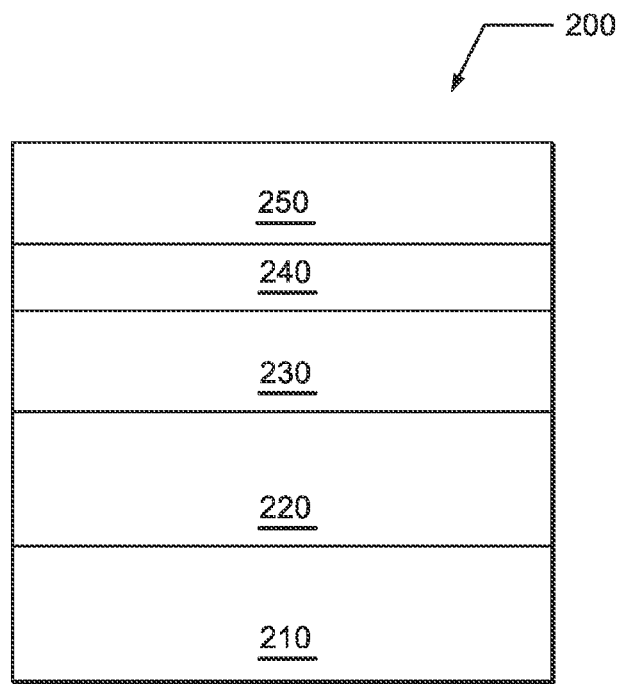
FIGS. 2A through 2H illustrate schematically a method for double patterning a thin film on a substrate according to an embodiment of the invention.
Figure 2B:
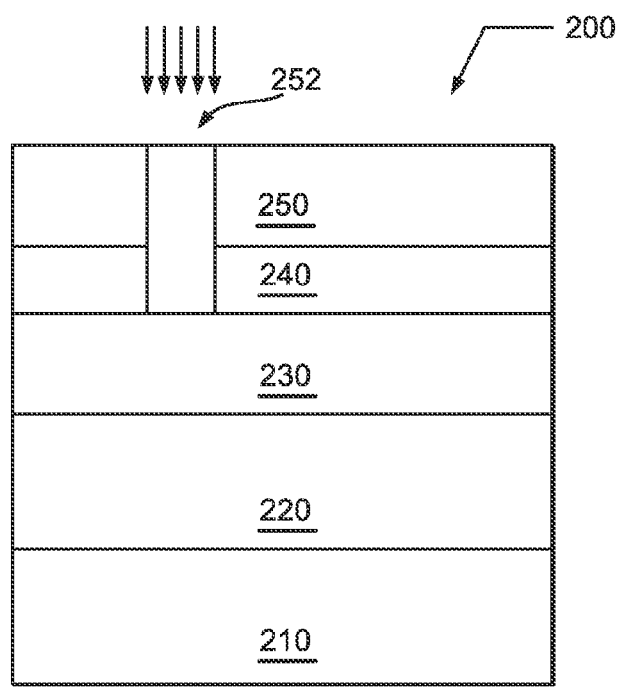

In 520 and as shown in FIG. 2B, the first photo-resist layer 250 and the developable ARC layer are imaged with a first image pattern 252. The exposure to EM radiation through a reticle is performed in a dry or wet photo-lithography system. The image pattern can be formed using any suitable conventional stepping lithographic system, or scanning lithographic system. For example, the photo-lithographic system may be commercially available from ASML Netherlands B.V. (De Run 6501, 5504 DR Veldhoven, The Netherlands), or Canon USA, Inc., Semiconductor Equipment Division (3300 North First Street, San Jose, Calif. 95134).

Figure 2C:
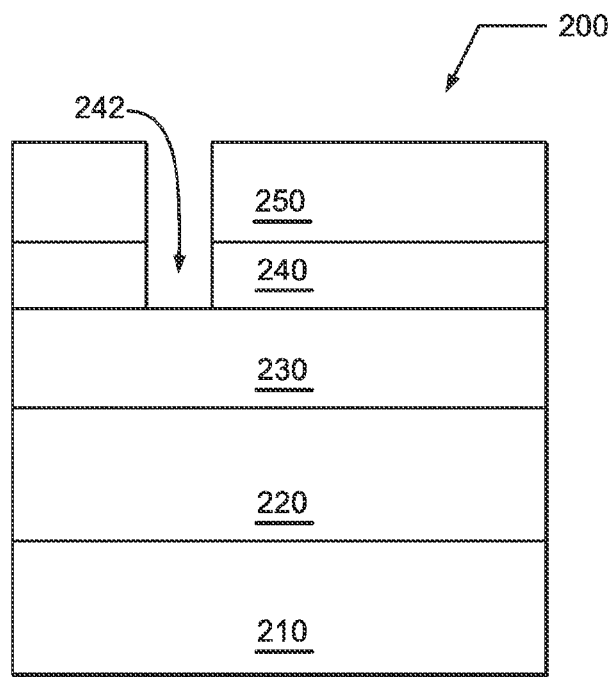

In 530 and as shown in FIG. 2C, the exposed first photo-resist layer 250 and the exposed developable ARC layer 240 are subjected to a developing process to remove the first image pattern region 252, and form a first pattern 242 in the developable ARC 240. The developing process can include exposing the substrate to a developing solvent in a developing system, such as a track system. For example, the track system can comprise a Clean Track ACT 8, ACT 12, or Lithius resist coating and developing system commercially available from Tokyo Electron Limited (TEL). By this method using a developable ARC layer 240, the step in the prior art of dry etching the substrate to transfer the first pattern into the underlying ARC layer is eliminated.

Figure 2D:
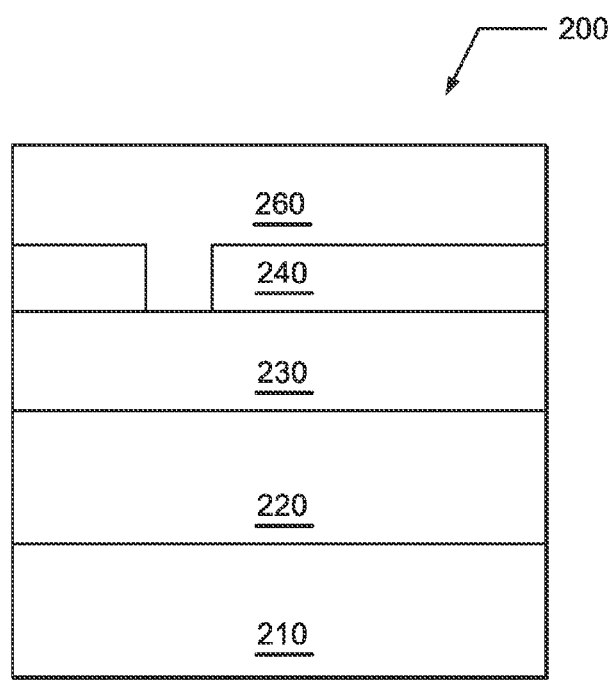

In 540 and as shown in FIG. 2D, the first layer of photo-resist 250 is removed. For example, the first photo-resist layer 250 may be removed using a wet stripping process, a dry plasma ashing process, or a dry non-plasma ashing process. Thereafter, a second photo-resist layer 260 is formed on the developable ARC layer 240.

The second photo-resist layer 260 may comprise 248 nm (nanometer) resists, 193 nm resists, 157 nm resists, or EUV (extreme ultraviolet) resists. The second photo-resist layer 260 can be formed using a track system. For example, the track system can comprise a Clean Track ACT 8, ACT 12, or Lithius resist coating and developing system commercially available from Tokyo Electron Limited (TEL). Other systems and methods for forming a photo-resist film on a substrate are well known to those skilled in the art of spin-on resist technology.

Figure 2E:
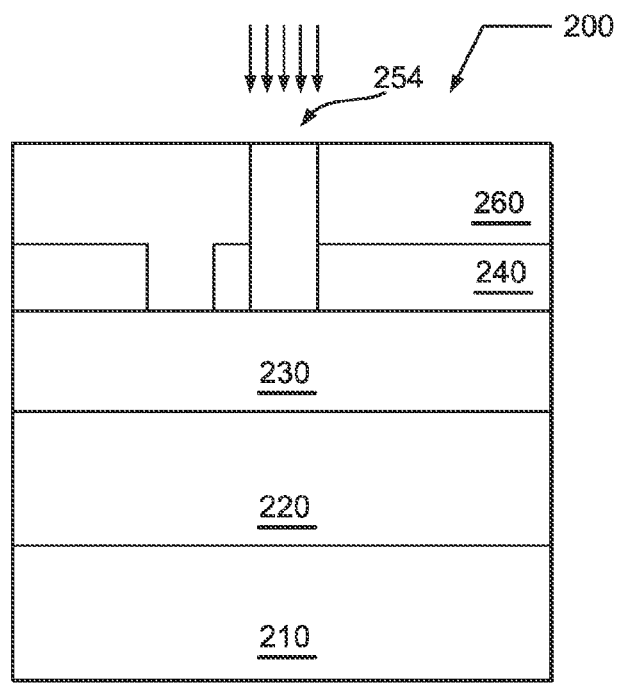

In 550 and as shown in FIG. 2E, the second photo-resist layer 260 and the developable ARC layer are imaged with a second image pattern 254. The exposure to EM radiation through a reticle is performed in a dry or wet photo-lithography system. The image pattern can be formed using any suitable conventional stepping lithographic system, or scanning lithographic system. For example, the photo-lithographic system may be commercially available from ASML Netherlands B.V. or Canon USA, Inc. Semiconductor Equipment Division.

Figure 2F:
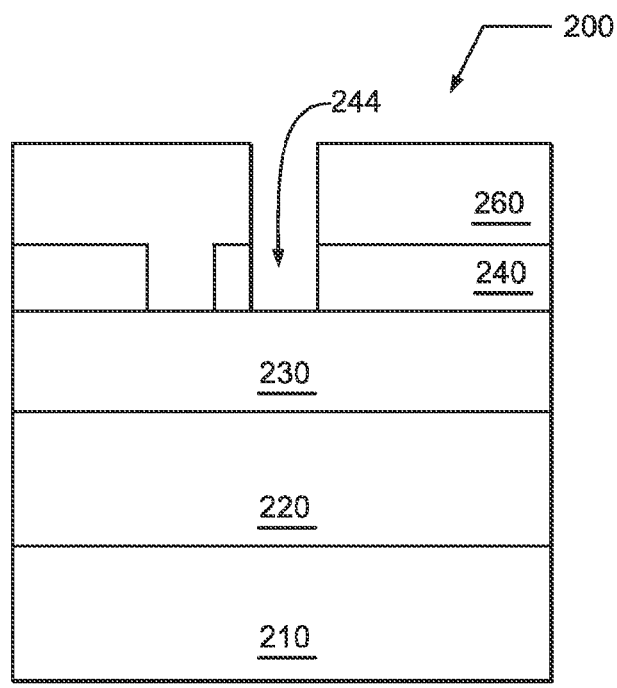

In 560 and as shown in FIG. 2F, the exposed second photo-resist layer 260 and the exposed developable ARC layer 240 are subjected to a developing process to remove the second image pattern region 254, and form a second pattern 244 in the developable ARC 240. The developing process can include exposing the substrate to a developing solvent in a developing system, such as a track system. For example, the track system can comprise a Clean Track ACT 8, ACT 12, or Lithius resist coating and developing system commercially available from Tokyo Electron Limited (TEL). By this method using a developable ARC layer 240, the step in the prior art of dry etching the substrate to transfer the second pattern into the underlying ARC layer is eliminated.

Figure 2G:
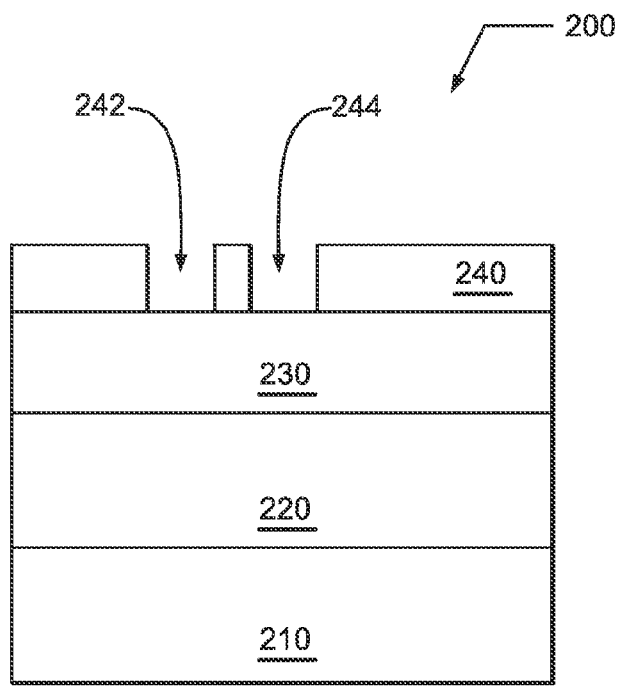
Figure 2H:
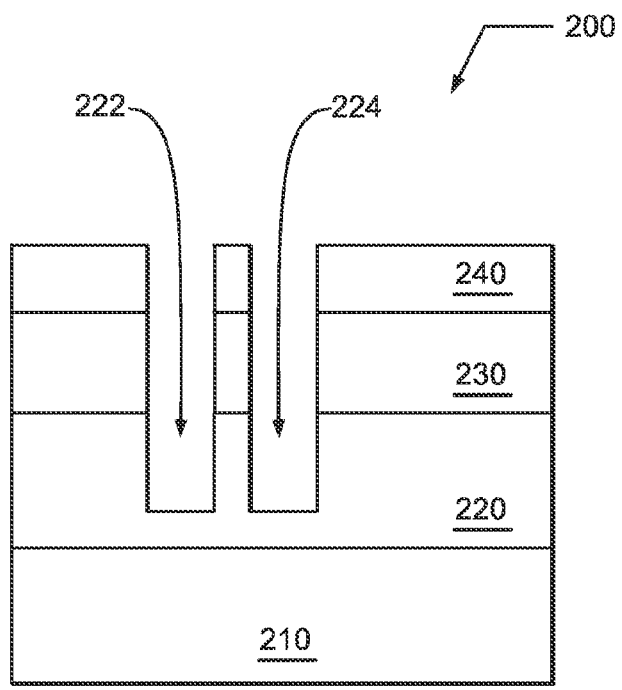
Figure 3:
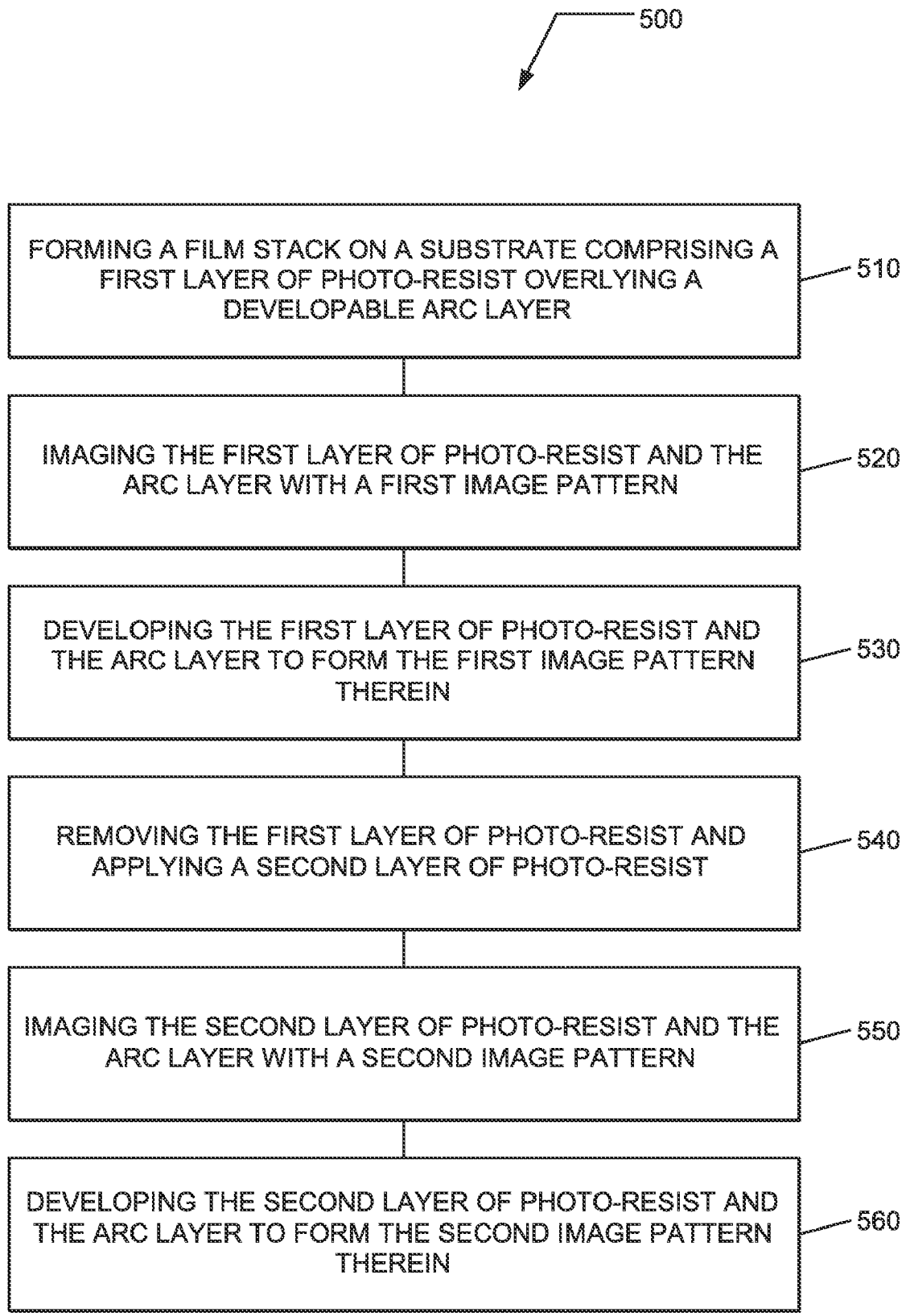
FIG. 3 illustrates a flow chart of a method for double patterning a thin film on a substrate according to an embodiment of the invention.

After 560, the substrate 210 can be further processed to transfer the double pattern, i.e., the first and second image patterns, to the thin film 220. As illustrated in FIGS. 2G and 2H, respectively, the further processing can include removing the layer of photo-resist 260, and transferring the first and second ARC patterns 242 and 244 to the underlying OPL 230, if present, and to the thin film 220 to form a first feature pattern 222 and a second feature pattern 224 using one or more etching processes. The one or more etching processes may include any combination of wet or dry etching processes. The dry etching processes may include dry plasma etching processes or dry non-plasma etching processes.

Although only certain embodiments of this invention have been described in detail above, those skilled in the art will readily appreciate that many modifications are possible in the embodiments without materially departing from the novel teachings and advantages of this invention. For example, several embodiments illustrate the use of positive tone developable resists and developable ARC layers; however, other embodiments are contemplated that utilize negative tone developable resists and developable ARC layers. Accordingly, all such modifications are intended to be included within the scope of this invention.

What is claimed is:

1. A method of double patterning a thin film on a substrate, comprising:
    preparing a film stack on said substrate, said film stack comprising said thin film formed on said substrate, an organic planarization layer (OPL) formed on said thin film using a spin-on technique so as to be effective for planarizing a surface, a developable anti-reflective coating (ARC) layer formed on said OPL, and a first layer of photo-resist formed on said developable ARC layer, wherein said first layer of photo-resist and said developable ARC layer are the same tone;
    imaging said first layer of photo-resist and said developable ARC layer with a first image pattern;
    developing said first layer of photo-resist and said developable ARC layer to form said first image pattern in said first layer of photo-resist and said developable ARC layer;
    removing said first layer of photo-resist;
    forming a second layer of photo-resist on said developable ARC layer, wherein said second layer of photo-resist is the same tone as said first layer of photo-resist and said developable ARC layer;
    imaging said second layer of photo-resist and said developable ARC layer with a second image pattern that is spaced apart from said first image pattern at a distance that is greater than zero and less than or equal to approximately 50 nm; and
    developing said second layer of photo-resist and said developable ARC layer to form said second image pattern in said second layer of photo-resist and said developable ARC layer.

2. The method of claim 1, further comprising:
    removing said second layer of photo-resist following said developing said second layer of photo-resist and said developable ARC layer.

3. The method of claim 1, further comprising:
    transferring said first image pattern and said second image pattern in said developable ARC layer to said OPL and said thin film using one or more etching processes.

4. The method of claim 3, wherein said transferring comprises performing a wet etching process, or a dry etching process, or a combination thereof.

5. The method of claim 1, wherein said forming said first layer of photo-resist comprises forming a 248 nm resist, a 193 nm resist, a 157 nm resist, or an EUV resist, or a combination of two or more thereof on said developable ARC layer.

6. The method of claim 1, wherein said forming said second layer of photo-resist comprises forming a 248 nm resist, a 193 nm resist, a 157 nm resist, or an EUV resist, or a combination of two or more thereof on said developable ARC layer.

7. The method of claim 1, wherein said imaging said first image pattern comprises imaging a first image pattern using a dry photo-lithography system, or a wet lithography system, or both.

8. The method of claim 1, wherein said imaging said first image pattern comprises imaging a first image pattern using a 248 nm photo-lithography system, a 193 nm photo-lithography system, a 157 nm photo-lithography system, or an EUV photo-lithography system, or a combination of two or more thereof.

9. The method of claim 1, wherein said imaging said second image pattern comprises imaging a second image pattern using a dry photo-lithography system, or a wet lithography system, or both.

10. The method of claim 1, wherein said imaging said second image pattern comprises imaging a second image pattern using a 248 nm photo-lithography system, a 193 nm photo-lithography system, a 157 nm photo-lithography system, or an EUV photo-lithography system, or a combination of two or more thereof.

11. The method of claim 1, wherein said forming said developable ARC layer comprises forming a developable ARC layer configured for 248 nm photo-lithography, 193 nm photo-lithography, 157 nm photo-lithography, or EUV photo-lithography.

12. The method of claim 1, further comprising:
removing said second layer of photo-resist following said developing said second layer of photo-resist and said developable ARC layer; and
transferring said first image pattern and said second image pattern in said developable ARC layer to said OPL and said thin film using an etching process.

13. The method of claim 1, wherein said first layer of photo-resist, said second layer of photo-resist, and said developable ARC layer are all positive tone.

14. A method of double patterning a thin film on a substrate, comprising:
preparing a film stack on said substrate, said film stack comprising said thin film formed on said substrate, an organic planarization layer (OPL) comprising polyacrylate resin, epoxy resin, phenol resin, polyamide resin, polyimide resin, unsaturated polyester resin, polyphenylenether resin, polyphenylenesulfide resin, or benzocyclobutene (BCB) formed on said thin film, a developable anti-reflective coating (ARC) layer formed on said OPL, and a first layer of photo-resist formed on said developable ARC layer, wherein said first layer of photo-resist and said developable ARC layer are the same tone;
imaging said first layer of photo-resist and said developable ARC layer with a first image pattern;
developing said first layer of photo-resist and said developable ARC layer to form said first image pattern in said first layer of photo-resist and said developable ARC layer;
removing said first layer of photo-resist;
forming a second layer of photo-resist on said developable ARC layer, wherein said second layer of photo-resist is the same tone as said first layer of photo-resist and said developable ARC layer;
imaging said second layer of photo-resist and said developable ARC layer with a second image pattern that is spaced apart from said first image pattern at a distance that is greater than zero and less than or equal to approximately 50 nm; and
developing said second layer of photo-resist and said developable ARC layer to form said second image pattern in said second layer of photo-resist and said developable ARC layer.

15. The method of claim 14, wherein said first layer of photo-resist, said second layer of photo-resist, and said developable ARC layer are all positive tone.

\* \* \* \* \*